United States Patent
Chen et al.

(10) Patent No.: US 9,340,712 B2
(45) Date of Patent: May 17, 2016

(54) ADHESIVE MATERIAL

(71) Applicants: Kuo Hsun Chen, Toufen Town (TW); Meng Chun Ko, Taichung (TW); Yi An Sha, New Taipei (TW); Hsiang Yun Yang, Hsin-Chu Hsien (TW)

(72) Inventors: Kuo Hsun Chen, Toufen Town (TW); Meng Chun Ko, Taichung (TW); Yi An Sha, New Taipei (TW); Hsiang Yun Yang, Hsin-Chu Hsien (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 14/135,849

(22) Filed: Dec. 20, 2013

(65) Prior Publication Data

US 2014/0374649 A1  Dec. 25, 2014

(30) Foreign Application Priority Data

Jun. 19, 2013 (TW) .............................. 102121676 A

(51) Int. Cl.

| | |
|---|---|
| C09J 11/04 | (2006.01) |
| C09J 163/00 | (2006.01) |
| C09J 113/00 | (2006.01) |
| C09J 11/06 | (2006.01) |
| C09J 163/02 | (2006.01) |
| C09J 163/04 | (2006.01) |
| C09J 171/12 | (2006.01) |
| C09J 7/00 | (2006.01) |
| C08G 59/40 | (2006.01) |
| C08G 59/50 | (2006.01) |
| H01L 33/64 | (2010.01) |
| H05K 7/20 | (2006.01) |
| C09J 109/02 | (2006.01) |
| C08K 3/22 | (2006.01) |
| C08K 3/28 | (2006.01) |

(52) U.S. Cl.
CPC .............. *C09J 163/00* (2013.01); *C08G 59/50* (2013.01); *C08K 3/22* (2013.01); *C08K 3/28* (2013.01); *C09J 109/02* (2013.01); *C09J 113/00* (2013.01); *H01L 33/64* (2013.01); *H05K 7/20* (2013.01); *C08G 2650/56* (2013.01)

(58) Field of Classification Search
None
See application file for complete search history.

(56) References Cited

U.S. PATENT DOCUMENTS

| | | | | |
|---|---|---|---|---|
| 3,972,821 | A * | 8/1976 | Weidenbenner et al. | C08K 7/12 156/231 |
| 4,866,108 | A * | 9/1989 | Vachon et al. ................ | 523/428 |
| 5,718,789 | A | 2/1998 | Gebhardt et al. | |
| 8,652,641 | B2 * | 2/2014 | Wang et al. ................... | 428/416 |
| 2011/0097568 | A1 * | 4/2011 | Kamae ............... | C08G 59/3209 428/222 |
| 2013/0062045 | A1 * | 3/2013 | Chu et al. ...................... | 165/185 |
| 2015/0079401 | A1 * | 3/2015 | Ohno ............................ | 428/416 |

OTHER PUBLICATIONS

American Heritage Dictionary, definition of thermal conductance, obtained from www.ahdictionary.com (retrieved Apr. 13, 2015).*
Matweb, Plastic Material Data Sheets (2010).*
Shackelford et al., CRC Materials Science and Engineering Handbook, 3d ed. (2001).*

* cited by examiner

*Primary Examiner* — Mark Kaucher
*Assistant Examiner* — Kregg Brooks
(74) *Attorney, Agent, or Firm* — Egbert Law Offices, PLLC

(57) ABSTRACT

An adhesive material comprises a polymeric component, a heat conductive filler and a curing agent. The polymeric component comprises 30%-60% by volume of the adhesive material, and comprises thermoset epoxy resin and polymeric modifier configured to improve impact resistance of the thermoset epoxy resin. The polymeric modifier comprises thermoplastic, rubber or the mixture thereof. The polymeric modifier comprises 4%-45% by volume of the polymeric component. The heat conductive filler is evenly dispersed in the polymeric component, and comprises 40%-70% by volume of the adhesive material. The curing agent is capable of curing the thermoset epoxy resin at a temperature below 140° C. The adhesive material has a heat conductivity greater than 3 W/m-K.

10 Claims, No Drawings

ADHESIVE MATERIAL

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present application relates to an adhesive material, and more particular to an insulating adhesive material having high heat conductivity and superior impact resistance.

2. Description of Related Art Including Information Disclosed Under 37 CFR 1.97 and 37 CFR 1.98.

The light emitting diodes (LEDs) have been used since 1960s, and usually used as indicating or signal lights. Because traditional LEDs do not have high power consumption, heat dissipation of LED packaging was not an issue. In recent years, lightness and power consumption of the LEDs used for television backlights or illumination have become increasingly high, and therefore heat dissipation becomes a crucial problem for LED illumination applications.

A traditional incandescent lamp dissipates about 70% heat by infrared radiation, so that heat accumulation in the lamp is not obvious. However, an LED usually emits visible light or ultraviolent light, and therefore it does not easily dissipate heat by radiation. In addition, small LED packaging area is hard to dissipate heat efficiently, resulting in LED luminous decay. Therefore, heat management is important for LED illumination applications.

Traditionally, LEDs transfer heat to a substrate through a metal lead flame, and thermal resistance of package is very high, e.g., 250-300° C./W. Then, LEDs are surface-mounted on to circuit board for packaging, in which a resin layer (FR4) adhered to the circuit board is used for heat transfer. The large heat dissipation area can significantly decrease thermal resistance. However, FR4 may not be suitable for packaging of high power LED due to its low heat conductivity coefficient. Nowadays, as to LEDs, heat-source devices or other electronic devices, a thermal interface material is employed to combine such devices and a heat dissipation structure. The thermal interface material usually contains an organic silicon polymer, which has low viscosity and good reliability but is costly. Moreover, though the silicon polymer can withstand high temperature, it may generate liquefied residue or outgas caused by material degradation after being used for a certain time period.

BRIEF SUMMARY OF THE INVENTION

The present application provides an adhesive material, which may be made in the form of a plate. This material has high heat conductivity, and is insulative and adhesive. The adhesive material can be used for the combination between metal components or between electronic devices and metal components. The combinations need not further use other fixing components.

The adhesive material of the present application comprises a polymeric component, a heat conductive filler and a curing agent. The polymeric component comprises 30%-60% by volume of the adhesive material, and comprises thermoset epoxy resin and polymeric modifier configured to improve impact resistance of the thermoset epoxy resin. The polymeric modifier comprises thermoplastic, rubber or the mixture thereof. The polymeric modifier comprises 4%-45% by volume of the polymeric component. The heat conductive filler is evenly dispersed in the polymeric component, and comprises 40%-70% by volume of the adhesive material. The curing agent is capable of curing the thermoset epoxy resin at a temperature below 140° C. The adhesive material has a heat conductivity greater than 3 W/m-K.

In an embodiment, the rubber is 1.5-12% by volume of the adhesive material.

In an embodiment, the adhesive material in the form of a plate with a thickness of 200 µm has a thermal resistance below 0.5° C./W, which is measured according ASTM D5470.

In an embodiment, the strength of the adhesive material bonding to a metal component is greater than 300 g/cm$^2$ after the adhesive material is pressed with the metal component and cured.

In an embodiment, the curing agent is capable of curing the thermoset epoxy resin at a temperature of 80-105° C.

In an embodiment the thermoset epoxy resin is selected from the group consisting of end-epoxy-functional group epoxy resin, side chain epoxy functional group epoxy resin, tetra-functional group epoxy resin or the mixture thereof, e.g., bisphenol A epoxy resin. In an embodiment, the thermoplastic is selected from the group consisting of phenoxy resin, polysulfone, polyethersulfone, polystyrene, polyphenylene oxide, polyphenylene sulfide, polyamide, polyimide, polyetherimide, polyetherimide and silicone block copolymer, polyurethane, polyester, polycarbonate, acrylic resin, styrene, acrylonitrile, and styrene block copolymers.

In an embodiment, the rubber may be nitrile-butadiene rubber (NBR), e.g., carboxy-terminated polybutadieneacrylonitrile (CTBN), amino-terminated polybutadieneacrylonitrile (ATBN), hydroxy-terminated polybutadieneacrylonitrile (HTBN), epoxy-terminated polybutadieneacrylonitrile (ETBN), vinyl-terminated polybutadieneacrylonitrile (VTBN), and methacrylic-terminated polybutadieneacrylonitrile or the mixture thereof.

In an embodiment, the heat conductive filler comprises nitride, oxide or the mixture thereof, e.g., zirconium nitride, boron nitride, aluminum nitride, silicon nitride aluminum oxide, magnesium oxide, zinc oxide, silicon oxide, titanium oxide or the mixture thereof.

In an embodiment, the curing agent may be dicyandiamide, and a curing accelerator, e.g., urea or compound, may be further added to accelerate the curing process.

In an embodiment, the adhesive material has a hardness of 65-98 A which is measured according to ASTM D2240.

The adhesive material of the present application does not generate liquefied residue or outgas caused by material degradation, and the polymeric component at 25° C. does not have phase separation in a microscope inspection of 200× zoom. The adhesive material has high heat conductivity and superior adhesive strength, and therefore it is advantageous to be applied to LED illuminations in demand on high heat transfer efficiency.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

The adhesive material is made by adding heat conductive filler into the polymeric component. The polymeric component comprises thermoset epoxy resin and polymeric modifier, e.g., thermoplastic, rubber or mixture thereof. The polymeric modifier is configured to improve the impact resistance of the thermoset epoxy resin. In other words, the thermoset epoxy resin is an essential material, and either one or both of the thermoplastic and the rubber may be mixed with the thermoset epoxy resin. Table 1 shows the composition and volume percentage of the adhesive material of a comparative example (Comp.) and several embodiments (Em 1-Em 7) of the present application. Table 1 also records hardness, heat conductivity and observation of phase separation of the comparative example and embodiments.

curing process. Because the curing agent and the accelerator comprise only few volume percentages of the adhesive material, e.g., less than 3%, they are omitted in the Table 1.

The method for fabricating the adhesive material are described below. First, the thermoset epoxy resin and the thermoplastic and/or rubber are mixed at 200° C. for 30 minutes, so as to form a uniform mixture. The heat-conductive filler is then added into the uniform mixture at 200° C., and they are mixed evenly to form a uniform rubbery material. The curing agent or together with a curing accelerator are then added into the uniform rubbery material at a temperature of 80° C. The uniform rubbery material is hot-pressed between two release films at 100° C., and then is leveled under a pressure of 30 kg/cm$^2$, so as to form a lamella-shaped adhesive material. The rubbery material is cured during this process at 100° C.

In the Em 1 to Em 7, the adhesive material has high viscosity of about $10^5$ to $10^7$ poise, so there is no separation. The lamella-shaped adhesive material is rubbery rather than slurry-like, and therefore it is easily stored and processed. Moreover, the adhesive material can be processed by methods commonly used for a thermoplastic, e.g., extrusion, calendaring or injection molding, thereby enhancing its processability. Because thermoplastic can increase viscosity, the adhesive material can be formed by thermoplastic process. In Em 4 to Em 7, the thermoset epoxy resin and thermoplastic are cured and cross-linked, at a high temperature to form an

TABLE 1

| Composition | Comp | Em 1 | Em 2 | Em 3 | Em 4 | Em 5 | Em 6 | Em 7 |
|---|---|---|---|---|---|---|---|---|
| DER331 (bisphenol A epoxy resin) | 30 | 27 | 24 | 27 | 50 | 40 | 40 | 21 |
| BNE (side chain epoxy functional group epoxy resin) | 10 | 9 | 8 | 8 | 0 | 0 | 0 | 0 |
| PKHH (phenoxy, resin) | 0 | 0 | 0 | 0 | 5 | 10 | 5 | 5 |
| CTBN carboxy-terminated polybutadieneacrylonitrile | 0 | 2 | 6 | 15 | 0 | 0 | 5 | 9 |
| Al$_2$O$_3$ | 60 | 60 | 60 | 10 | 5 | 20 | 20 | 20 |
| BN | 0 | 2 | 0 | 0 | 40 | 0 | 0 | 0 |
| AlN | 0 | 0 | 2 | 40 | 0 | 30 | 30 | 35 |
| (CTBN + PKHH)/polymeric component | 0 | 5% | 16% | 30% | 9% | 20% | 20% | 40% |
| Hardness (ASTM D2240A) | 99A | 93A | 87A | 70A | 93A | 90A | 88A | 72A |
| Heat conductivity (W/mk) | 3.2 | 3.5 | 3.6 | 6.4 | 5.3 | 4.7 | 4.7 | 8.1 |
| Tg (° C.) | 135 | 130 | 124 | 114 | 118 | 114 | 107 | 98 |
| Phase separation (microscope 200x zoom) | No | No | No | Yes | No | No | No | No |

In Table 1, the thermoset epoxy resin uses DER331™ of Dow Chemical Company or further includes different kinds of epoxy chemicals, DER331™ is a liquid bisphenol A epoxy resin. BNE is a side chain epoxy functional group epoxy resin (bisphenol A phenolic resin), which is in solid state at room temperature and can be mixed with DER331™ to increase viscosity. The thermoplastic may use phenoxy resin, which has a molecular weight of larger than 30000. The rubber uses carboxy-terminated polybutadieneacrylonitrile (CTBN) to increase material strength and impact resistance. The heat conductive filler comprises aluminum oxide, boron nitride, aluminum nitride or the mixture thereof, and the average filler size ranges from 5-45 μm. The embodiments further use curing agent to cure the polymers. The curing agent uses dicyandiamide, which is configured to cure the thermoset epoxy resin at a temperature below 140° C. Preferably, a curing accelerator, e.g., urea, may be added to accelerate inter-penetration network (IPN) structure, which not only has the thermoset plastic property of no deformation at a high temperature and the thermoplastic property of being strong but not fragile, but also can be firmly adhered to metal electrodes or substrates.

Compared to the comparative example, Em 1 to Em 7, adding phenoxy resin and/or rubber, have lower hardness and lower glass transition temperature (Tg), and thus they have better impact resistance.

The curing temperature of the curing agent is below 140° C., or preferably between 80-105° C., to cure (crosslink) or catalyze polymerize the thermoset epoxy resin.

The thermoset epoxy resin may comprise uncured liquid epoxy resin, polymeric epoxy resin, phenolic epoxy resin or bisphenol A resin. The thermoset epoxy resin can be a mixture of plural polymers including end epoxy functional group epoxy resin, side chain epoxy functional group epoxy resin, tetra-functional group epoxy resin or the mixture thereof. In addition to BNE, side chain epoxy functional group epoxy resin may use CNE series. The thermoset epoxy resin comprises 30-60%, or 35%, 40%, 45%, 50% or 55% in particular, by volume of the adhesive material. At room temperature, the thermoset epoxy resin is in liquid state or solid state. The thermoset epoxy resin is preferably an uncured epoxy resin, and especially an uncured liquid epoxy resin defined by ASTM D1763. The term "epoxy resin" refers to a conventional dimeric epoxy resin, an oligomeric epoxy resin, or a polymeric resin with two epoxy functional groups. The epoxy resin may be a reaction product of bisphenol A with epichlorohydrin, a reaction product (novolac resin) of phenol with formaldehyde, a reaction product of epichlorohydrin, cycloaliphatics, peracid epoxy resin with glyceryl ether, a reaction product of epichlorohydrin with p-amino phenol, a reaction product of epichlorohydrin with glyoxal tetraphenol, phenolic epoxy resin or bisphenol A epoxy resin.

As the aforesaid embodiments, the thermoplastic may be a phenoxy resin with a molecular weight greater than 30000. The thermoplastic may include a hydroxy-phenoxyether polymer structure. The hydroxy-phenoxyether polymer is formed by a polymerization reaction of the stoichiometric mixture including diepoxide and difunctional species. The diepoxide is an epoxy resin with an epoxy equivalent weight of about 100 to 10000. The difunctional species may be dihydric phenol, dicarboxylic acid, primary amine, dithiol, disulfonamide, or bis-secondary amine. The difunctional species also includes a mixture comprising two different functional groups for reaction with the epoxide group, for example, salicylic acid and 4-hydroxybenzoic acid. The thermoplastic may be a reaction product of liquid epoxy resin with bisphenol A, bisphenol F, or bisphenol S, a reaction product of liquid epoxy resin with a divalent acid, or a reaction product of liquid epoxy resin with amines.

Moreover, the thermoplastic of the adhesive material may be essentially amorphous thermoplastic resin, such as phenoxy resin, polysulfone, polyethersulfone, polystyrene, polyphenylene oxide, polyphenylene sulfide, polyamide, polyimide, polyetherimide, polyetherimide/silicone block copolymer, polyurethane, polyester, polycarbonate, acrylic resin such as polymethyl methacrylate, styrene)/acrylonitrile and styrene block copolymers.

The rubber may be nitrile-butadiene rubber (NBR), such as carboxy-terminated polybutadieneacrylonitrile (CTBN), amino-terminated polybutadieneacrylonitrile (ATBN), hydroxy-terminated polybutadieneacrylonitrile (HTBN), epoxy-terminated polybutadieneacrylonitrile (ETBN), vinyl-terminated polybutadieneacrylonitrile (VTBN), or methacrylic-terminated polybutadieneacrylonitrile.

As to the thermoset epoxy resin, the curing agent is preferably dicyandiamide and may be used together with a curing accelerator. The commonly used curing accelerator includes urea or urea compounds, imidazole, or boron trifluoride. Moreover, the curing agent may be isophthaloyl dihydrazide, benzophenone tetracarboxylic dianhydride, diethyltoluene diamine, 3,5-dimethylthio-2,4-toluene diamine, dicyandiamide, or diaminodiphenyl sulfone (DDS) The curing agent may be substituted dicyandiamides, such as 2,6-xylenyl biguanide, solid polyamide, solid aromatic amine, solid anhydride hardener, phenolic resin hardener. For example, poly(p-hydroxy styrene), amine complex, and trimethylol propane triacrylate.

The heat conductive filler may comprise one or more ceramic powders that can be selected from nitride, oxide or the mixture thereof. The nitride can be selected from the group consisting essentially of zirconium nitride, boron nitride, aluminum nitride, and silicon nitride. The oxide can be selected from the group consisting essentially of aluminum oxide, magnesium oxide, zinc oxide, silicon dioxide and titanium dioxide. In general, heat conductivity of oxide is relatively low, whereas the amount of nitride is relatively low. Therefore, oxide and nitride can be complementary to each other when they are mixed. The heat conductive filler is evenly dispersed in the polymeric component and comprises 40%-70%, and preferably 50-65%, by volume of the adhesive material. In particular, the heat conductive filler may comprise 50%, 55%, 60% or 65% by volume of the adhesive material.

It can be seen from Table 1 that the polymeric modifier including thermoplastic and/or rubber comprises 4-45%, or 10%, 20%, 30% in particular, by volume of the polymeric component including thermoset epoxy resin, thermoplastic and rubber. At 25° C., the material of Em 3 containing rubber of 15% by volume, phase separation between different polymers was observed in a microscope inspection with 200× zoom. The phase separation would induce uneven mixture of polymers, and thus impact the properties of the polymeric component. Hence, the amount of rubber has to be limited to less than 12%, e.g., 1.5-12% or 4-10%, of the adhesive material.

The heat conductivity of the adhesive material is about 3-15 W/m-K, 5 W/m-K, 8 W/m-K, 10 W/m-K or 12 W/m-K. The adhesive material in the form of a plate with a thickness of 200 μm has a thermal resistance below 0.5° C./W or 0.4° C./W, which is measured according to ASTM 5470. The adhesive material has a hardness between 65 A-98 A, e.g., 75 A, 85 A or 95 A, which is measured according to ASTM D2240. As such, the adhesive material has good impact resistance, and therefore it is suitable for being used for bonding metal components. The metal components may comprise copper, aluminum, nickel, iron, tin, gold, silver or alloy thereof. In an embodiment, the strength of the adhesive material bonding to the metal component is greater than 300 g/cm$^2$ after the adhesive material is pressed and cured. It is obvious that the addition of thermoplastic can increase adhesive strength, by which the adhesive material becomes tough but not fragile. Therefore, the adhesive material is able to be strongly and firmly adhered to metal components such as metal electrodes or substrates. The adhesive strength may be larger than 350 kg/cm$^2$ or 400 kg/cm$^2$.

In summary, the adhesive material of the present application comprises a polymeric component, a heat conductive filler and a curing agent. The polymeric component comprises 30%-60% by volume of the adhesive material, and comprises thermoset epoxy resin and polymeric modifier. The polymeric modifier comprises thermoplastic, rubber or the mixture thereof, and the polymeric modifier comprises 4%-45% by volume of the polymeric component. The heat conductive filler is evenly dispersed in the polymeric component, and comprises 40%-70% by volume of the adhesive material. The curing agent is configured to cure the thermoset epoxy resin at a temperature below 140° C. The adhesive material has a heat conductivity greater than 3 W/m-K. The hardness of the adhesive material is about 65 A-98 A measured according to ASTM D2240. The adhesive material in the form of a plate with a thickness of 200 μm has a thermal resistance below 0.5° C./W. Moreover, the adhesive material is insulative and can withstand 500 volts, 600 volts or more.

The above-described embodiments of the present invention are intended to be illustrative only. Numerous alternative embodiments may be devised by persons skilled in the art without departing from the scope of the following claims.

We claim:

1. An adhesive material comprising:
   a polymeric component comprising 30%-60% by volume of the adhesive material, and the polymeric component comprising thermoset epoxy resin and polymeric modifier configured to improve impact resistance of the thermoset epoxy resin, the polymeric modifier comprising rubber or a mixture of rubber and thermoplastic, the polymeric modifier comprising 4%-45% by volume of the polymeric component;
   a heat conductive filler evenly dispersed in the polymeric component and comprising 40%-70% by volume of the adhesive material; and
   a curing agent configured to cure the thermoset epoxy resin at a temperature below 140° C.;
   wherein the adhesive material has a heat conductivity greater than 3 W/m-K;
   wherein the rubber comprises 1.5-12% by volume of the adhesive material and is selected from the group consisting of nitrile-butadiene rubber, carboxy-terminated polybutadieneacrylonitrile, amino-terminated polybutadieneacrylonitrile, hydroxy-terminated polybutadieneacrylonitrile, epoxy-terminated polybutadieneacrylonitrile, vinyl-terminated polybutadieneacrylonitrile, and methacrylic-terminated polybutadieneacrylonitrile and mixtures thereof;
   wherein the thermoplastic is selected from the group consisting of phenoxy resin, polysulfone, polyethersulfone, polystyrene, polyphenylene oxide, polyphenylene sulfide, polyamide, polyimide, polyetherimide, polyetherimide and silicone block copolymer, polyurethane, polyester, polycarbonate, acrylic resin, styrene, acrylonitrile, and styrene block copolymers;
   wherein the adhesive material has a hardness of 65-98 A which is measured according to ASTM D2240, and wherein the polymeric component at 25° C. does not have a phase separation at a microscope inspection of 200× zoom.

2. The adhesive material of claim 1, wherein the curing agent is configured to cure the thermoset epoxy resin at a temperature of 80-105° C.

3. The adhesive material of claim 1, wherein the thermoset epoxy resin is selected from the group consisting of end epoxy functional group epoxy resin, side chain epoxy functional group epoxy resin, tetra-functional group epoxy resin and mixtures thereof.

4. The adhesive material of claim 1, wherein the thermoset epoxy resin comprises bisphenol A epoxy resin.

5. The adhesive material of claim 1, wherein the curing agent is dicyandiamide.

6. The adhesive material of claim 1, wherein the heat conductive filler comprises nitride, oxide or mixtures thereof.

7. The adhesive material of claim 1, wherein the heat conductive filler is selected from the group consisting of zirconium nitride, boron nitride, aluminum nitride, silicon nitride, aluminum oxide, magnesium oxide, zinc oxide, silicon oxide, titanium oxide or mixtures thereof.

8. The adhesive material of claim 1, wherein the heat conductive filler comprises 50-65% by volume of the adhesive material.

9. The adhesive material of claim 1, further comprising a curing accelerator.

10. The adhesive material of claim 9, wherein the curing accelerator is urea or urea compounds.

* * * * *